United States Patent [19]
Gassmann

[11] Patent Number: 4,817,167
[45] Date of Patent: Mar. 28, 1989

[54] METHOD OF RECEIVING FREQUENCY-MODULATED STEREO MULTIPLEX SIGNALS

[75] Inventor: Gerhard-Guenter Gassmann, Neuweiler-Agenbach, Fed. Rep. of Germany

[73] Assignee: Deutsche ITT Industries GmbH, Freiburg, Fed. Rep. of Germany

[21] Appl. No.: 73,613

[22] Filed: Jul. 15, 1987

[30] Foreign Application Priority Data

Aug. 7, 1986 [EP] European Pat. Off. ......... 86110931.2

[51] Int. Cl.⁴ .............................................. H04H 5/00
[52] U.S. Cl. .......................................... 381/3; 381/7; 455/324
[58] Field of Search .................. 381/2, 34, 7; 455/208, 455/324

[56] References Cited

U.S. PATENT DOCUMENTS

| | | | |
|---|---|---|---|
| 3,701,948 | 10/1972 | McAuliffe | 455/202 |
| 4,464,770 | 8/1984 | Maurer et al. | 445/265 |

FOREIGN PATENT DOCUMENTS

| | | |
|---|---|---|
| 0062872 | 10/1982 | European Pat. Off. |
| 0088467 | 9/1983 | European Pat. Off. |
| 0180339 | 7/1986 | European Pat. Off. |
| 1263113 | 3/1968 | Fed. Rep. of Germany |
| 92198 | 10/1968 | France |
| 1163330 | 4/1969 | United Kingdom |
| 2040615 | 8/1980 | United Kingdom |

Primary Examiner—Forester W. Isen
Attorney, Agent, or Firm—Thomas L. Peterson

[57] ABSTRACT

A method and a circuit arrangement for receiving frequency-modulated stereo multiplex signals is disclosed in which the channel to be received is converted to the zero IF using negative feedback for reducing the frequency deviation in the IF band. The conversion takes place in a quadrature converter stage, and adjacent-channel selectivity is provided by low-pass filtering the two outputs of the quadrature converter stage, with the slopes of the selectivity characteristics of the two low-pass filters being relatively slight and lying partly in the zero IF band. The amount of the average attenuation of the frequency-modulated stereo subcarrier signal is equal to the amount of the reduction of the frequency deviation of the frequency-modulated main-channel signal. The negative-feedback signal is the demodulated main-channel signal, the amount of negative feedback being determined by an amplifier in the negative-feedback path. If the demodulated stereo multiplex signal is used as the feedback signal, a third low-pass filter is necessary which passes the main-channel signal while suppressing the stereo subcarrier signals as far as possible.

5 Claims, 3 Drawing Sheets

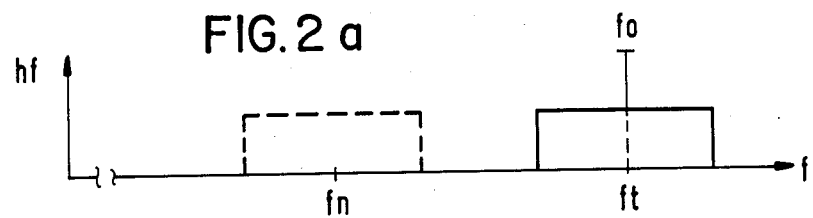
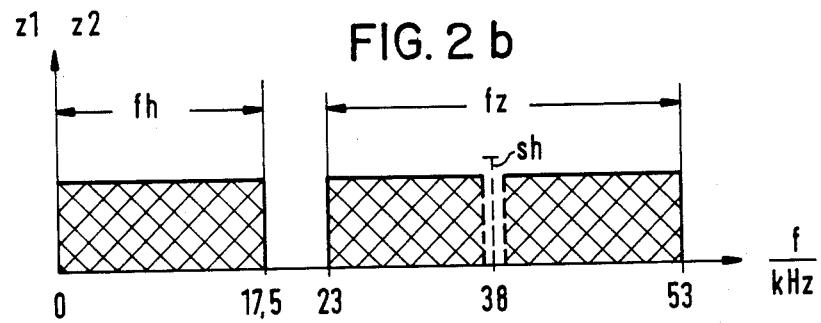
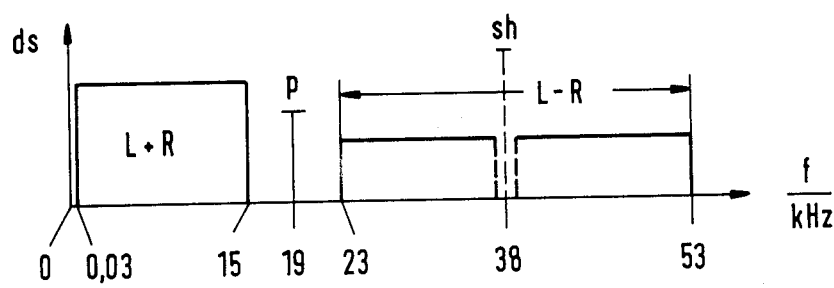
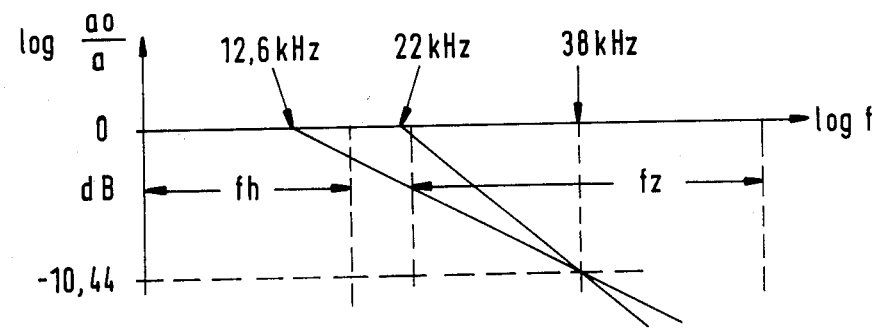

METHOD OF RECEIVING FREQUENCY-MODULATED STEREO MULTIPLEX SIGNALS

BACKGROUND OF THE INVENTION

The present invention relates to a method receiving frequency-modulated (FM) stereo multiplex signals transmitted at radio frequencies (RF) wherein during conversion from the RF band to the intermediate frequency (IF) band, the demodulated signal serves as a negative feedback signal to reduce the frequency deviation in the IF band, and wherein adjacent-channel selectivity is provided by low-pass filtering after the conversion to the IF band.

Such a method of FM reception and a circuit for carrying out the same are described in Auslegeschrift DE-B No. 12 63 113. FIG. 5 of that publication shows an embodiment for receiving a frequency-modulated signal and converting it into the range of audibility using negative feedback for reducing the frequency deviation in the IF band, with the adjacent channels being suppressed. The channels to be received contain stereo signals with a stereo subcarrier frequency of 38 kHz, and the complete stereo multiplex signal is transmitted in the respective radio-frequency channel with a peak frequency deviation of $+/-75$ kHz. FIGS. 1a to 3b of that publication show how the provision of adjacent-channel selectivity by means of low-pass filters can be simplified if the heterodyning frequency for the signal to be received is chosen so that the center frequency of the frequency-modulated IF signal is lower than twice the value of the peak frequency deviation of the signal to be received. Therefore, this frequency conversion method is also called "low IF method."

SUMMARY OF THE INVENTION

The object of the invention is to improve a receiving method of the above kind in such a way that it can be implemented using simple integrated circuits, with adjacent-channel selectivity, in particular, being provided by analog low-pass filters suitable for integration. Another object of the invention is to design the circuit arrangement so that the signals can be largely processed in digital form.

BRIEF DESCRIPTION OF THE DRAWINGS

The invention will now be explained in more detail with reference to the accompanying drawings, in which:

FIGS. 2a to 2c show schematically the spectra of a few signals;

FIG. 4 shows the frequency responses of the first and second low-pass filters in a double-logarithmic plot together with the schematic spectrum of the mixer signal of FIG. 2b.

DETAILED DESCRIPTION OF A PREFERRED EMBODIMENT

A special advantage of the invention lies in the fact that, to provide adjacent-channel selectivity after conversion of the desired incoming RF signal to the IF value, use can be made of low-pass filters with relatively slightly sloping selectivity characteristics, which are thus integrable as one- or multi-stage RC filters. The frequency-determining elements are integrable metal-oxide capacitors, resistors, or current sources.

Figure 1:
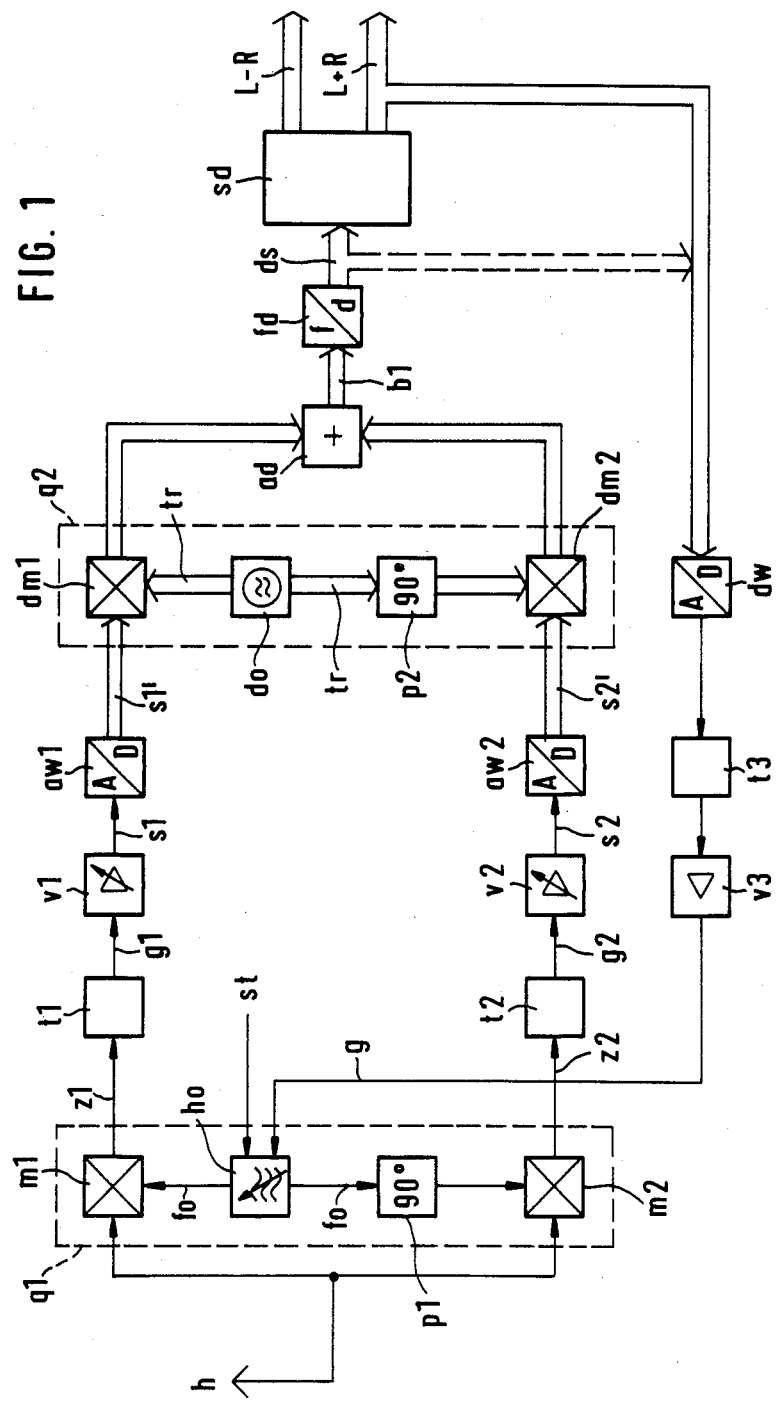
FIG. 1 is a block diagram of an embodiment of a circuit arrangement in accordance with the invention.

In FIG. 1, the antenna signal h, which may be amplified if necessary and contains the frequency-modulated stereo multiplex signals hf, is applied to the first inputs of the first and second mixers m1, m2. These form part of the quadrature converter stage q1, which also contains the frequency-variable RF oscillator ho and the 90° phase shifter p1, whose input is supplied with the oscillator signal of, and whose output is connected to the second input of the second mixer m2. The second input of the first mixer m1 is fed with the oscillator signal of directly. The control signal st for the RF oscillator ho controls the frequency of the oscillator signal of. This frequency is placed about in the middle of the channel to be received, so that the center frequency of the IF band is approximately zero, and the IF band appears folded, so to speak, starting at 0 Hz and covering about one half the RF channel bandwidth. Therefore, this frequency-conversion method is also called "zero IF method."

Conventional "unfolding" techniques are based on various principles which resemble the phasing method of single sideband demodulation and are described, for example, in a book by H. Meinke and F. W. Gundlach "Taschenbuch der Hochfrequenztechnik," 2nd Edition, Berlin 1962, pages 1309 to 1313, especially FIG. 25.1, "Schema des Einseitenbandumsetzers nach Weaver."

The output of the first mixer m1 is coupled to the input of the first low-pass filter t1, and the output of the second mixer m2 to the input of the second low-pass filter t2. The slopes of the selectivity characteristics of the first low-pass filter t1 for the first mixer signal z1 and of the second low-pass filter t2 for the second mixer signal z2 are shown schematically in FIG. 4. The passband covers essentially the range of the frequency-modulated main-channel signal fh, while the slope of the selectivity characteristic lies in the range of the frequency-modulated stereo subcarrier signal fz and attenuates the latter by an average amount which will be defined later.

The output of the first low-pass filter t1, namely the first filtered signal g1, and the output of the second low-pass filter t2, namely the second filtered signal g2, are fed to the first variable-gain amplifier v1 and the second variable-gain amplifier v2, respectively, whose amplified output signals are applied to the inputs of the first analog-to-digital converter aw1 and the second analog-to-digital converter aw2, respectively. The two variable-gain amplifiers v1, v2, which are adjusted to the same gain, adapt the two filtered signals g1, g2 to the dynamic ranges of the two analog-to-digital converters aw1, aw2, so that the resolutions of the latter are utilized in optimum fashion.

The two digitized signals s1' and s2' are fed to the first inputs of the first digital mixer dm1 and the second digital mixer dm2, respectively. The digital mixers form part of the digital quadrature stage q2, which serves to "unfold" the IF band. It further includes the digital oscillator do and the digital 90° phase shifter p2. The output of each of the two digital mixers dm1, dm2 is fed to one of the inputs of the adder ad, whose output is the "unfolded" frequency-modulated signal, namely the basic signal b1, which is applied to the FM detector fd for demodulation. The demodulated signal ds is the digital stereo multiplex signal at the baseband; its frequency range is shown schematically in FIG. 2c for the corresponding analog stereo multiplex signal. The demodulated signal ds is fed to the stereo decoder sd, which provides the main-channel signal L+R and the stereo subcarrier signal L−R. These two signals are fed to further subcircuits (not shown) for further processing.

The main-channel signal L+R is also fed to the digital-to-analog converter dw, whose output passes through the third low-pass filter t3 and then through the amplifier v3. The output of the latter serves as the negative feedback signal g for the RF oscillator ho. The third low-pass filter t3 rejects all frequencies outside the main-channel signal L+R.

Instead of the main-channel signal L+R, the demodulated signal ds can be applied to the digital-to-analog converter dw. In this case, the subsequent third low-pass filter t3 must pass the main-channel signal L+R and reject the stereo subcarrier signal L−R. In both cases, the gain of the third amplifier v3 is chosen so that the value of the average amplitude reduction of the frequency-modulated stereo subcarrier signal fz is equal to the value of the frequency-deviation reduction of the frequency-modulated main-channel signal L+R.

If the frequency deviation of the frequency-modulated main-channel signal L+R is reduced by a factor of 3, for example, the average amplitude of the demodulated stereo subcarrier signal L−R will be too large in comparison with that of the demodulated main-channel signal L+R and must be reduced by the factor 3, i.e., by −10.44 dB. If the suppression of the stereo subcarrier signal L−R by the third low-pass filter t3 is incomplete, the negative feedback signal g will also cause a deviation reduction in the range of the frequency-modulated stereo subcarrier signal fz, and it is by this amount that the average amplitude of the frequency-modulated stereo subcarrier signal fz must be reduced less. As a result, adjacent-channel selectivity is impaired, of course. This difficulty is avoided by the above-described connection of the digital-to-analog converter dw to the stereo decoder sd. The signal-processing time in the stereo decoder sd must, however, be sufficiently short to prevent any uncontrollable oscillations during this feedback.

On the analog side, the two signal paths may contain asymmetries caused, for example, by inequalities of the two mixers m1, m2, the two low-pass filters t1, t2, or the two variable-gain amplifiers v1, v2. Asymmetries may affect the amplitudes, but also the phases of the first and second signals s1, s2. Such amplitude or phase errors can be detected and compensated, for example, with the control or compensating circuit disclosed in applicant's own European Application No. 86 10 3522.8 (ITT case S. Mehrgardt 18), which was not published prior to the effective filing date of the present application. Unfolding, FM demodulation, and stereo signal decoding will then take place under nearly ideal conditions.

FIG. 2a shows schematically the spectrum of the frequency-modulated stereo multiplex signal hf in the range of the radio-frequency carrier ft. The frequency range, also referred to as "channel," is centered about the frequency of the radio-frequency carrier ft. As is well known, the bandwidth of the frequency-modulated stereo multiplex signal hf is approximately equal to twice the sum of the maximum frequency deviation and the maximum signal frequency.

The adjacent channel in the range of the adjacent radio frequency carrier fn, which is removed from the radio frequency carrier ft by, e.g., four times the maximum frequency deviation, is shown by broken lines. The oscillator signal of for down-conversion lies at the center of the radio-frequency channel.

FIG. 2b shows characteristic spectra of the deviation-reduced first and second mixer signals z1, z2 at the zero IF. The frequency-modulated main-channel signal fh, which has been folded, extends from about 0 to +17.5 kHz, and the frequency-modulated stereo subcarrier signal fz, likewise folded, extends from about 23 kHz to 53 kHz. The cross-hatching is to indicate that in the ranges shown, the upper and lower sidebands are folded over on each other.

For the bandwidth calculation it is assumed that both the main-channel signal and the stereo subcarrier signal are transmitted with a deviation of +/−37.5 kHz. This is based on the consideration that, if a sine-wave tone is to be transmitted with maximum volume only in the right channel, for example, the maximum frequency deviation for the total signal must not exceed the standard deviation of +/−75 kHz. For the main-channel frequency band from 30 Hz to 15 kHz, with the negative feedback factor 3, the above-specified frequency range of the folded frequency-modulated main-channel signal fh is thus given by the relation:

$$(37.5 \text{ kHz} + 15 \text{ kHz})/3 = 17.5 \text{ kHz}$$

The stereo subcarrier signal L−R is present in the form of a suppressed-carrier amplitude modulation, the suppressed stereo subcarrier sh having a frequency of 38 kHz. The bandwidth of this signal within the stereo multiplex signal extends from 23 kHz to 53 kHz. For this signal, the negative feedback is not effective; it thus retains the assumed frequency deviation of ±37.5 kHz.

This, however, can also be interpreted differently, for according to the known formula for calculating phase deviation, at the assumed frequency deviation of ±37.5 kHz, the associated phase deviation referred to the frequency of the 38-kHz stereo subcarrier is:

$$\pm \Delta \Phi = (\pm 37.5 \text{ kHz}/38 \text{ kHz}) \approx +/- 1 \text{ rad}$$

Figure 3A:
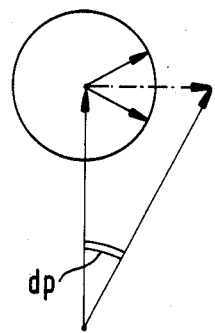
FIGS. 3a and 3b are vector representations showing the influence of the signal amplitude on the phase angle in the case of phase-modulated signals.
Figure 3B:
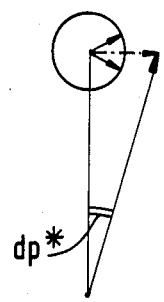

This, however, is generally regarded as a phase modulation rather than a frequency modulation, because unlike pure frequency modulation, phase modulation permits the phase deviation to be reduced by reducing the amplitude of the modulation spectrum, see also FIGS. 3a and 3b. This is used in the receiving method in accordance with the invention.

FIG. 2c shows schematically the spectrum of the stereo multiplex signal ds according to the European stereo broadcasting standard. The main-channel signal L+R contains the left-right sum signal, and the stereo subcarrier signal L−R the left-right difference signal. This signal is present in the form of a suppressed-carrier amplitude modulation, the suppressed stereo subcarrier sh having a frequency of 38 kHz, and the 19 kHz pilot signal p being transmitted to permit the stereo subcarrier to be recovered. As described above, the bandwidths extend from 30 Hz to 15 kHz for the main-channel signal L+R, and from 23 kHz to 53 kHz for the tereo subcarrier signal L−R, the latter having a gap at 38 kHz as a result of the carrier suppression.

FIGS. 3a and 3b show vector diagrams of a phase modulation. If the amplitudes of the two sidebands are reduced as shown in FIG. 3b, the phase deviation dp, dp* and, thus, the frequency deviation are reduced. This is achieved by applying negative feedback. Assuming that the frequency-deviation reduction takes place only of the frequency-modulated main-channel signal fh and is to be 3:1, the 38 kHz stereo subcarrier signal L−R after FM demodulation would be too large by a factor of 3. However, since the modulation is a phase modulation rather than a frequency modulation, as explained above, the correct amplitude ratio between the demodulated stereo subcarrier signal L−R and the demodulated main-channel signal L+R can be recovered by reducing the amplitude of the frequency-modulated stereo subcarrier signal fz by a factor of 3. At the low modulation index used here, the spectrum of the phase modulation roughly corresponds to the spectrum of an amplitude modulation with lower and upper sideband signals.

In FIG. 4, the passbands and the slopes of the selectivity characteristics of the first and second low-pass filters t1, t2 are shown in a double-logarithmic plot. The slope is 6 dB or 12 dB per octave; accordingly, the cutoff frequency is 12 kHz or 22 kHz. Since a negative-feedback factor of 3 was assumed, the attenuation $a_o/a$ in the range of the stereo subcarrier frequency of 38 kHz has a value of −10.44 dB; this corresponds to one third of the original amplitude. The associated ranges of the frequency-modulated main-channel signal fh and the frequency-modulated stereo subcarrier signal fz of FIG. 2b are also shown for comparison.

If the bandwidth of the frequency-modulated stereo subcarrier signal fh is greater than the assumed value of 17.5 kHz, e.g., due to a corresponding sound signal in the right and left channels, the operation of the circuit is practically unaffected, even if the amplitudes at the band limit are slightly reduced by the slope of the selectivity characteristic, because above a minimum signal amplitude, the subsequent frequency modulation is independent of the amplitude of the frequency-modulated signal, in this case the frequency-modulated main-channel signal fh, over a wide range, as is well known. The negative-feedback factor will preferably be chosen to be so large that during normal operation, the frequency-modulated main-channel signal fh and the frequency-modulated stereo subcarrier signal fz are clearly separated in frequency.

Figure 5:
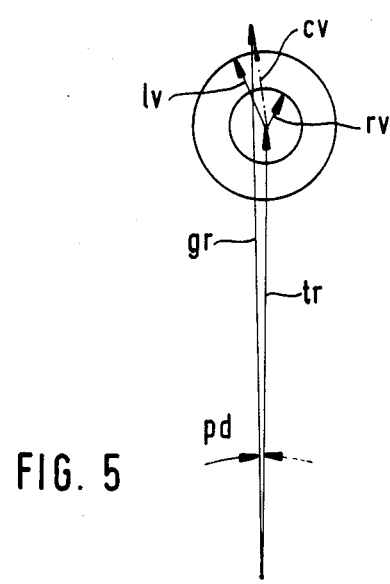
FIG. 5 is a vector representation of the phase error resulting during the demodulation of amplitude-modulated signals with sidebands of different amplitude.

FIG. 5 is a vector representation of the demodulation of an amplitude-modulated signal with different sidebands which corresponds to the frequency-modulated stereo subcarrier signal after low-pass filtering. The long vector is the added carrier signal tr, which corresponds to the output signal of the digital oscillator do. The two sideband vectors of the assumed sine-wave modulation are the left-hand, less reduced sideband vector lv and the right-hand, more reduced sideband vector rv. Their resultant cv and the carrier signal tr give a total resultant gr which has a small phase difference pd from the carrier signal tr. The total resultant gr is the vector responsible for the amplitude of the demodulated stereo subcarrier signal. For a different phase position of the added carrier signal tr, the amplitude of the demodulated stereo subcarrier signal is correspondingly smaller.

The phase of the added carrier signal tr depends on the phase of the pilot signal p. The phase of the latter, too, may be changed by the slope of the selectivity characteristic, which may begin already there. However, this will not cause any distortion but will possibly result in a further reduction of the amplitudes of the demodulated stereo subcarrier signal, as was just described. This is permissible as long as the permissible total reduction is not exceeded.

What is claimed is:

1. A method of receiving frequency-modulated stereo multiplex signals transmitted at radio frequencies and providing a demodulated main-channel signal from said frequency-modulated signals, said frequency-modulated signals including a frequency-modulated stereo subcarrier signal having a first frequency range and a frequency-modulated main-channel signal having a second frequency range different from said first frequency range, said method comprising:
   receiving frequency-modulated stereo multiplex signals; converting said frequency-modulated signals to the intermediate frequency band by quadrature conversion which uses a negative feedback signal for reducing the frequency deviation of said frequency-modulated main-channel signal by a predetermined factor in the intermediate frequency band, said negative feedback signal being said demodulated main-channel signal, and the center of the intermediate frequency band being approximately zero; and
   filtering said frequency modulated signals after said frequency modulated signals are converted to the intermediate frequency band to provide adjacent channel selectivity, said filtering having selectivity characteristics that are different for said first frequency range of said frequency-modulated stereo subcarrier signal and said second frequency range in said main-channel signal, said selectivity characteristics, on the average, reducing the instantaneous amplitudes of said frequency-modulated stereo subcarrier signal by said predetermined factor.

2. A method as defined in claim 1 additionally comprising the steps of:
   amplifying said frequency-modulated signals in the intermediate frequency band; and
   digitizing said frequency-modulated signals after said amplifying step.

3. An apparatus for receiving frequency-modulated stereo multiplex signals transmitted at radio frequencies and providing a demodulated main-channel signal from said frequency-modulated signals, said frequency-modulated signals including a frequency-modulated stereo subcarrier signal having a first frequency range and a frequency-modulated main-channel signal having a second frequency range different from said first frequency range, said apparatus comprising:
   a receiver for receiving frequency-modulated stereo multiplex signals;
   a converter for converting said frequency-modulated signals to the intermediate frequency band by a quadrature converter which uses a negative feedback signal for reducing the frequency deviation of said frequency-modulated main-channel signal by a predetermined factor in the intermediate frequency band, said negative feedback signal being said demodulated main-channel signal, and the center of the intermediate frequency band being approximately zero; and a filter for filtering said frequency-modulated signals after said frequency-modulated signals are converted to the intermediate frequency band to provide adjacent channel selectivity, said filter having selectivity characteristics that are different for said first frequency range of said frequency-modulated stereo subcarrier signal and said second frequency range of said main-channel signal, said selectivity characteristics, on the average, reducing the instantaneous amplitudes of said frequency-modulated stereo subcarrier signal by said predetermined factor.

4. An apparatus as defined in claim 3 wherein said filter comprises a first monolithic integrated low-pass filter and a second monolithic low-pass filter whose frequency-determining elements are metal-oxide elements.

5. An apparatus as defined in claim 3 additionally comprising means for compensating for amplitude and phase errors during the conversion and filtering of said frequency-modulated signals.

* * * * *